US008699210B2

(12) United States Patent  
Aiello et al.

(10) Patent No.: US 8,699,210 B2  
(45) Date of Patent: Apr. 15, 2014

(54) INTEGRATED WATER CURRENT CONNECTION FOR MOTOR DRIVE

(75) Inventors: Marc F. Aiello, Oakmont, PA (US); Peter Willard Hammond, Greensburg, PA (US); Edward Alan Cheesman, Chicora, PA (US); Wayne Sheldon Jordan, Cranberry Township, PA (US); Jonathan Kunkle, Irwin, PA (US)

(73) Assignee: Siemens Industry, Inc., Alpharetta, GA (US)

( * ) Notice: Subject to any disclaimer, the term of this patent is extended or adjusted under 35 U.S.C. 154(b) by 366 days.

(21) Appl. No.: 12/129,895

(22) Filed: May 30, 2008

(65) Prior Publication Data

US 2008/0295998 A1   Dec. 4, 2008

Related U.S. Application Data

(60) Provisional application No. 60/941,133, filed on May 31, 2007.

(51) Int. Cl.
*H05K 7/20* (2006.01)
*F28D 15/00* (2006.01)
*H02M 7/00* (2006.01)

(52) U.S. Cl.
CPC .............. *H05K 7/20* (2013.01); *H05K 7/2089* (2013.01); *H05K 7/20927* (2013.01); *H02M 7/003* (2013.01); *F28D 15/00* (2013.01)
USPC ........... 361/676; 361/677; 361/678; 361/698; 361/699; 361/701; 174/15.1; 174/15.6

(58) Field of Classification Search
CPC ... H05K 7/20; H05K 7/2089; H05K 7/20927; H02M 7/003; F28D 15/00
USPC ................. 361/679, 676–678, 698, 699, 701; 174/15.1, 15.6; 165/104.28
See application file for complete search history.

(56) References Cited

U.S. PATENT DOCUMENTS 2,535,187 A * 12/1950 Anderson et al. ............. 174/15.7
2,549,264 A * 4/1951 Timmins ..................... 174/21 JS (Continued)

FOREIGN PATENT DOCUMENTS

| EP | 1750360 A | 2/2007 |
| JP | 2004357427 A | 12/2004 |
| JP | 2006003947 A | 1/2006 |

OTHER PUBLICATIONS

English machine translation of JP/2004-357427, Dec. 16, 2004.*

(Continued)

*Primary Examiner* — Anatoly Vortman

(57) ABSTRACT

A system for cooling a multi-cell power supply, the system including a water pump, a water-to-air heat exchanger in fluid communication with the water pump, and a supply water manifold in fluid connection with the water-to-air-heat exchanger. The system further includes a plurality of power cells in fluid communication with the supply water manifold via one or more water hoses, and a multi-winding device in fluid communication with the plurality of power cells via at least one water-cooled bus, wherein the at least one water cooled bus electrically connects the power cells to secondary windings of the multi-winding device. The water-cooled buses provide both electrical current as well as cooling fluid to each winding of the multi-winding device, thereby eliminating a need for separate cooling and power connections.

20 Claims, 2 Drawing Sheets

(56) References Cited

U.S. PATENT DOCUMENTS

| | | | | |
|---|---|---|---|---|
| 2,932,682 A * | 4/1960 | Barrass | | 174/19 |
| 2,979,644 A * | 4/1961 | Erwin | | 257/665 |
| 2,992,290 A * | 7/1961 | Swerdlow | | 174/16.2 |
| 2,992,372 A * | 7/1961 | Himeon et al. | | 257/714 |
| 3,021,380 A * | 2/1962 | Barrass | | 174/15.7 |
| 3,275,921 A * | 9/1966 | Fellendorf et al. | | 363/141 |
| 3,333,044 A * | 7/1967 | Toto | | 174/15.7 |
| 3,551,581 A * | 12/1970 | Goodman | | 174/15.7 |
| 3,604,831 A * | 9/1971 | Goodman | | 174/15.7 |
| 3,624,488 A | 11/1971 | Rabut | | |
| 3,636,415 A * | 1/1972 | Kruer | | 257/684 |
| 3,646,245 A * | 2/1972 | Swerdlow | | 174/21 JS |
| 3,662,137 A * | 5/1972 | Cleaveland | | 200/289 |
| 3,777,238 A * | 12/1973 | Rabut | | 257/714 |
| 3,808,350 A * | 4/1974 | Kluge et al. | | 174/15.7 |
| 3,908,073 A * | 9/1975 | Hubner | | 174/19 |
| 3,946,142 A * | 3/1976 | Kellow et al. | | 174/15.6 |
| 3,999,002 A * | 12/1976 | Rasquin | | 174/15.3 |
| 4,479,029 A * | 10/1984 | Banov et al. | | 174/15.7 |
| 4,535,036 A | 8/1985 | Kelm et al. | | |
| 4,588,428 A * | 5/1986 | Kanngiesser | | 62/99 |
| 5,408,209 A * | 4/1995 | Tanzer et al. | | 336/60 |
| 5,412,304 A * | 5/1995 | Abbott | | 320/108 |
| 5,625,545 A | 4/1997 | Hammond | | |
| 5,905,642 A | 5/1999 | Hammond | | |
| 6,396,241 B1 * | 5/2002 | Ramos et al. | | 320/108 |
| 6,603,662 B1 * | 8/2003 | Ganrot | | 361/698 |
| 2004/0240237 A1 * | 12/2004 | Okayama et al. | | 363/39 |
| 2007/0048561 A1 * | 3/2007 | Aiello et al. | | 429/13 |

OTHER PUBLICATIONS

Japanese Office Action drafted Sep. 21, 2012, dispatched Sep. 25, 2012 corresponding to Japanese Application No. 2010-510554 (10 pages).

* cited by examiner

INTEGRATED WATER CURRENT CONNECTION FOR MOTOR DRIVE

CROSS-REFERENCE TO RELATED APPLICATIONS

This application claims the priority benefit of U.S. Provisional Patent Application No. 60/941,133.

BACKGROUND

This application discloses an invention that is related, generally and in various embodiments, to a system and method for cooling a multi-cell power supply.

Multi-cell power supplies are known in the art. Such power supplies generally include a three-phase transformer and a plurality of power cells which are electrically connected to secondary windings of the transformer. Each power cell accepts three-phase AC input power from secondary windings of the transformer and outputs a single-phase AC voltage. The power connections between the secondary windings of the transformer and the power cells are realized with either bus or cable, and the bus or cable is either convection cooled or force cooled by air.

In multi-cell power supplies, the transformer and the power cells may be cooled with either air or water. For water-cooled applications, the individual power cells are typically cooled with a fluid stream that is separate from the fluid stream that cools the respective secondary windings of the transformer which supplies the power to the power cells. The water-cooled systems generally include a water supply manifold, a water return manifold, an individual hose from the water supply manifold to each power cell, an individual hose from the water supply manifold to each secondary winding of the transformer, an individual hose from the water return manifold to each power cell, an individual hose from the water return manifold to each secondary winding of the transformer, a water pump, and a water-to-air heat exchanger. As water flows through the secondary windings of the transformer and the power cells, heat is transferred from the secondary windings of the transformer and the power cells to the water. As the heated water flows through the water-to-air heat exchanger, heat is transferred from the water to the air passing over the water-to-air heat exchanger, thereby cooling the water.

Due to the parallel nature of the flow paths of the water, such cooling systems tend to be relatively expensive to manufacture and operate. The high number of hoses required for the above-described piping arrangement adds to the complexity and cost of the cooling system. With the parallel flow path arrangement, the required flow rate in gallons per minute (GPM) needed to effectively cool the secondary windings of the transformer and the power cells is inherently higher. As the cost of a water pump tends to be a function of the required flow rate, the cost of the water pump required for such a cooling system is relatively expensive.

In addition, the high flow rate results in a low temperature rise of the water when heat is transferred from the secondary windings of the transformer and the power cells to the water. When the heated water flows through the water-to-air heat exchanger, the relatively low temperature of the water due to the higher flow rate reduces the efficiency of the water-to-air heat exchanger, thereby decreasing the effectiveness of the cooling system.

Yet another drawback of conventional cooling systems is potential for leaks from either failed hoses or failed connections between the hoses and other components of the cooling system. For example, due to high water pressure required to achieve the necessary flow rate, fittings and hoses near the water pump may be subjected to high pressures and have a higher likelihood of failure. A water leak could lead to overheating of the power supply, or in the case where the water directly contacts the cells, cause a dangerous situation requiring immediate stopping of the power supply.

Still another drawback of conventional cooling systems is that the bus or cable connecting the secondary windings of the transformer to the power cells releases heat into the air inside the enclosure of the power supply, so that internal air-to-water heat exchangers must be supplied to transfer this heat into the water. The temperature of the internal air is increased by heat, which may adversely affect the local electronic circuits.

SUMMARY OF THE INVENTION

Embodiments disclosed herein are a system for cooling a multi-cell power supply by integrating portions of the electrical and cooling delivery systems.

In one general respect, the embodiments disclose a system for cooling a multi-cell power supply, the system including a fluid pump and a heat exchanger in fluid communication with the fluid pump. The system further includes a plurality of power cells in fluid communication with the heat exchanger; and a multi-winding device in fluid communication with the power cells via fluid-cooled buses, wherein the fluid-cooled buses electrically connect the power cells to secondary windings of the multi-winding device. The fluid-cooled buses provide both electrical current as well as cooling fluid to each winding of the multi-winding device, thereby eliminating a need for separate cooling and power connections.

In another general respect, the embodiments disclose a system for cooling a multi-cell power supply, the system including a water pump, a water-to-air heat exchanger in fluid communication with the water pump, and a supply water manifold in fluid connection with the water-to-air-heat exchanger. The system further includes a plurality of power cells in fluid communication with the supply water manifold via one or more water hoses, and a multi-winding device in fluid communication with the plurality of power cells via at least one water-cooled bus, wherein the at least one water cooled bus electrically connects the power cells to secondary windings of the multi-winding device. The water-cooled buses provide both electrical current as well as cooling fluid to each winding of the multi-winding device, thereby eliminating a need for separate cooling and power connections.

In another embodiment, a method of operating a multi-winding power device includes delivering power from a multi-winding power device via a bus, and circulating a fluid within the bus while the delivering occurs. The fluid may be distributed to the power cell or cells so that the fluid warms by absorbing heat from the power cell or cells. The warmed water may be circulated to a heat exchanger that cools the water, and the cooled water may then be redistributed to at least one power cell.

DESCRIPTION OF DRAWINGS

Various embodiments of the invention are described herein by way of example in conjunction with the following figure.

DETAILED DESCRIPTION

It is to be understood that the figures and description of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

As used herein and in the appended claims, the singular forms "a," "an," and "the" include the plural reference unless the context clearly dictates otherwise. Unless defined otherwise, all technical and scientific terms used herein have the same meanings as commonly understood by one of ordinary skill in the art. As used herein, the term "comprising" means "including, but not limited to."

Figure 1:
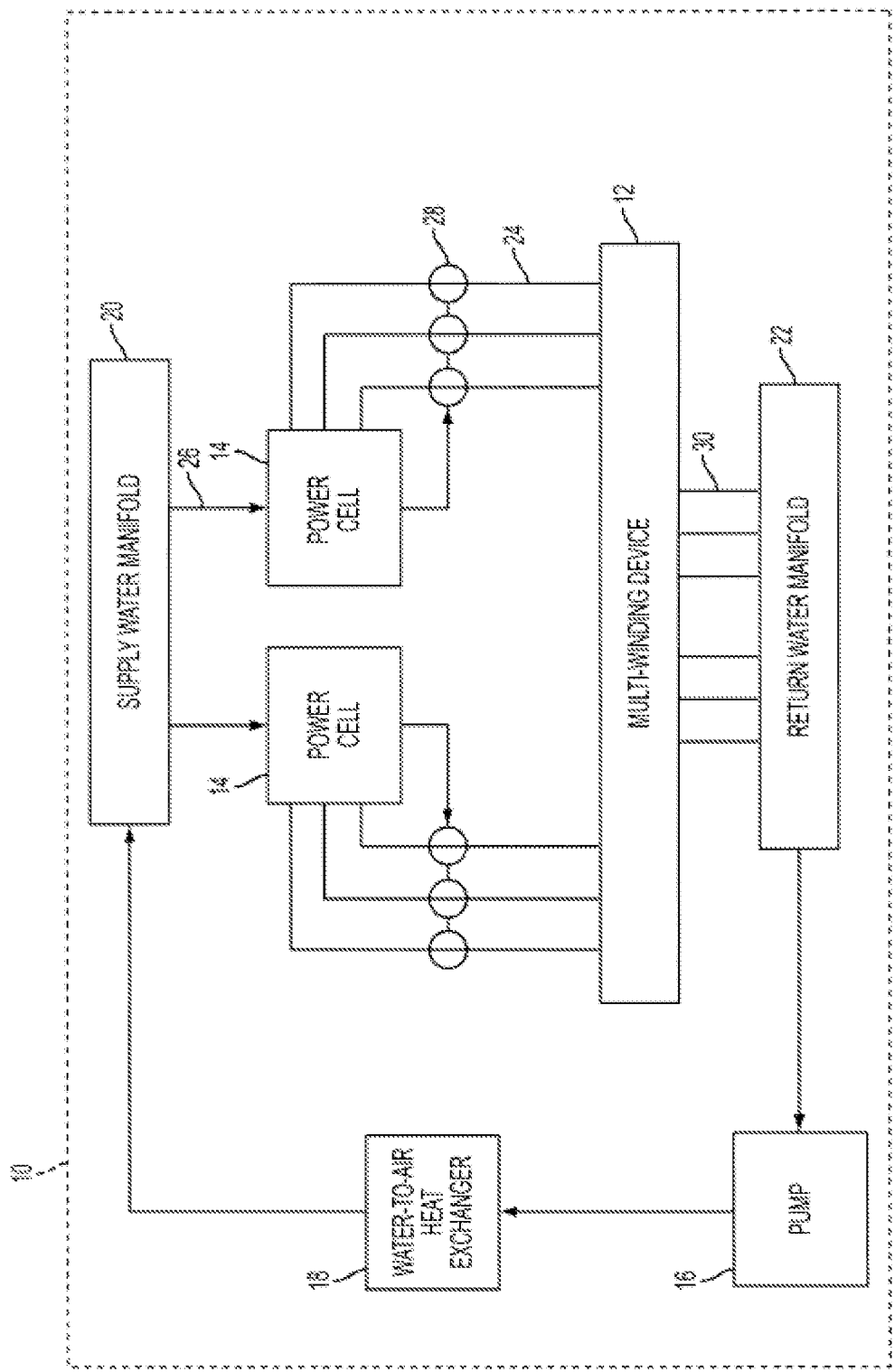
FIG. 1 illustrates an exemplary embodiment of a system for cooling a multi-cell power supply.

FIG. 1 illustrates an exemplary embodiment of a system 10 for cooling a multi-cell power supply. The system 10 may be utilized to dissipate the heat generated by a power supply having a plurality of power cells. A power cell is a device which accepts three-phase AC input power, outputs a single-phase AC voltage, and includes an AC-DC rectifier, a smoothing filter, and an output DC-to-AC converter. Various embodiments of a power supply having a plurality of power cells are described, for example, in U.S. Pat. No. 5,625,545 to Hammond ("the '545 patent"), which is hereby incorporated by reference in its entirety.

According to various embodiments, the system 10 forms a portion of the power supply. According to other embodiments, at least a portion of the system 10 is external to the power supply. For ease of explanation purposes, the system 10 will be described in the context of its use in a power supply which is similar to the power supply described in the '545 patent. However, the system 10 may also be utilized in applications other than a power supply.

The system 10 includes a multi-winding device 12, a plurality of power cells 14, a water pump 16, a water-to-air heat exchanger 18, a supply water manifold 20, and a return water manifold 22. The water is de-ionized and may include, for example, glycol in certain applications. As used herein, the term "water" refers to the fluid which circulates through the system 10. It should be noted though that water as a circulating fluid is only shown by way of example, and other fluids could be used depending on the application.

The multi-winding device 12 is a transformer or transformer-like device which includes three primary windings and a plurality of secondary windings. The multi-winding device 12 is configured to receive three-phase input power at a particular voltage and deliver three-phase power at a lower voltage to each of the power cells 14. The number of secondary windings may vary from application to application depending upon the number of power cells 14 utilized.

Unlike traditional power cell/transformer electrical connections which utilize either buses or cables, each individual power cell 14 is electrically connected to three secondary windings of the multi-winding device 12 via three water cooled buses 24 (one for each phase). Thus, there are three water cooled buses 24 in the system 10 for each power cell 14. According to various embodiments, the water cooled buses 24 are fabricated from copper tubing. The copper tubing electrically connects the power cell 14 to the respective secondary windings of the multi-winding device 12 and also provides a flow path between the power cell 14 and the multi-winding device 12 for the water which circulates through the system 10.

The water-cooled buses, as well as all hoses used for fluid connections, may be fitted with or designed to include self-closing valves or fittings. By including self-closing valves or fittings, safety and reliability are both increased as the fluid flow through the system does not need to be interrupted to remove or replace a cell of individual winding, rather when the cell or individual winding is removed, the hose or bus will self-close, thereby stemming the fluid flow through that hose or bus only.

When the power supply and the system 10 are operating the multi-winding device 12, the power cells 14, and the water-cooled buses 24 generate heat. As water passes through the power cells 14, the multi-winding device 12, and the water-cooled buses 24, the water operates to cool these components by absorbing heat generated by the components. The absorbed heat warms the water and the water pump 16 delivers the warmer water to the water-to-air heat exchanger 18. Air which passes over the water-to-air heat exchanger 18 absorbs heat transferred from the water, thereby cooling the water. From the water-to-air heat exchanger 18, the cooler water flows to the supply water manifold 20. According to various embodiments, the water pump 16 and the water-to-air heat exchanger 18 form a portion of the power supply. Thus, for such embodiments, the system 10 forms a portion of the power supply. According to other embodiments, the water pump 16 and/or the water-to-air heat exchanger 18 are external to the power supply. It should be noted that a water-to-air heat exchanger is used only by way of example and other heat exchanger, e.g., a forced cooled water heat exchanger may be used.

The supply water manifold 20 receives the cooler water from the water-to-air heat exchanger 18 and distributes the water in parallel to the various power cells 14 via individual hoses 26. The number of individual hoses 26 may vary from application to application based on the number of power cells 14. As the water collectively passes through the various power cells 14, the water absorbs heat generated by the power cells 14, thereby raising the temperature of the water. The water which has passed through a given power cell 14 is received by a local manifold 28 which distributes the water to the three respective water cooled buses 24 which electrically connect the given power cell 14 to the multi-winding device 12. The number of local manifolds 28 may vary from application to application based on the number of power cells 14. According to various embodiments, each local manifold 28 may form a portion of its corresponding power cell 14, or the local manifold may be mounted separately from the corresponding power cell 14.

The water distributed from the local manifolds 28 to the respective water-cooled buses 24 flows to the multi-winding device 12 where the water is passed through copper or other appropriate tubing to the secondary windings of the multi-winding device 12 to absorb heat generated by the secondary windings of the multi-winding device 12. The water exiting the copper tubing of the multi-winding device 12 flows to the return water manifold 22 via individual hoses 30. The water received by the return water manifold 22 flows back to the water pump 16.

As described hereinabove, the system 10 significantly reduces the number of hoses and hose connections to the multi-winding device 12 and significantly reduces the flow rate required to effectively cool the power supply when compared to known systems. In addition, as the reduced flow rate results in an increased temperature of the water entering the water-to-air heat exchanger 18, the system 10 also significantly increases the efficiency of the water-to-air heat exchanger 18 when compared to known systems.

By utilizing the electrical connections (i.e., the water cooled buses 24) between the power cells 14 and the secondary windings of the multi-winding device 12 to deliver water from the power cells 14 to the secondary windings of the multi-winding device 12, the need for separate sets of electrically conducting buses and water connections is eliminated. Also, by directly cooling the electrical conductors (i.e., the water cooled buses 24) between the power cells 14 and the secondary windings of the multi-winding device 12 with circulating water, the conductors can be smaller and less costly than traditional air-cooled bus connections. Finally, the directly cooled buses 24 do not release heat into the air inside the power supply enclosure, resulting in a lower ambient temperature for the local electronic circuits.

Figure 2:
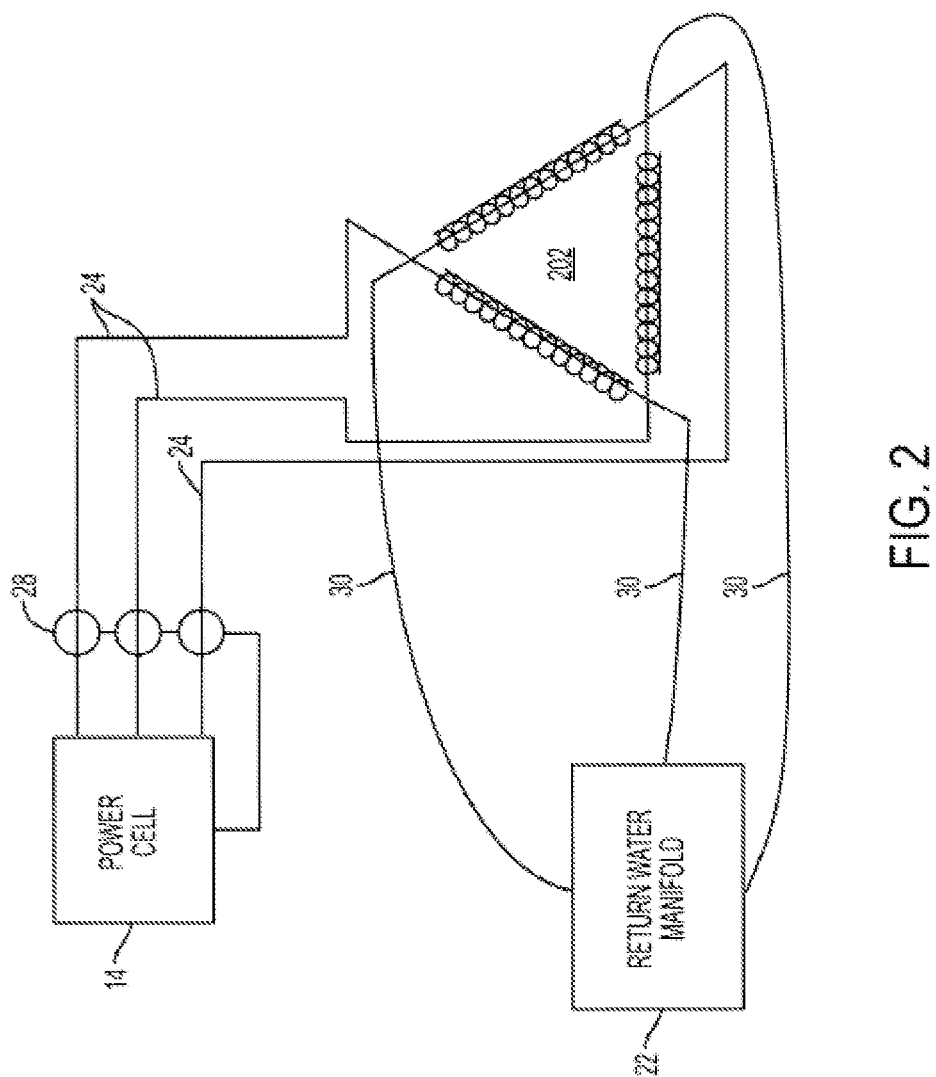
FIG. 2 illustrates a detailed view of a connection between a power cell and a multi-winding device as introduced in FIG. 1.

FIG. 2 illustrates in more detail a connection between a power cell and a secondary winding. In this example, power cell 14 is both electrically and fluidly connected to secondary windings 202. As before in the discussion of FIG. 1, water flows from power cell 14 to local manifold 28. Here, the water is distributed to each of the three electrical buses 24. Once the water is distributed to one of electrical buses 24, each individual electrical bus 24 connects to a single phase-winding of secondary windings 202. The water passes though the single winding, thereby cooling the winding. The water then passes through individual hoses 30 to return water manifold 22. As before, the returned water is pumped back through a heat exchanger to a supply manifold (not shown in FIG. 2), and is distributed to each of the power cells. FIG. 2 shows three separate hoses 30 leading back to return water manifold 22, but it should be noted that this is merely shown by way of example. A single return hose may be used in certain applications where a single hose is preferable (e.g., the return water manifold is a long distance away from the multi-winding device).

While several embodiments of the invention have been described herein by way of example, those skilled in the art will appreciate that various modifications, alterations, and adaptions to the described embodiments may be realized without departing from the spirit and scope of the invention defined by the appended claims.

What is claimed is:

1. A system for cooling a multi-cell power supply, the system comprising:
   a water pump;
   a heat exchanger in fluid communication with the water pump;
   a plurality of power cells in fluid communication with the heat exchanger, wherein each of the power cells generates heat and forms a first heat source;
   a plurality of water-cooled buses operably connected to the plurality of power cells; and
   a multi-winding device comprising:
      a primary winding, and
      a plurality of secondary windings for supplying power to the plurality of power cells, wherein the secondary windings generate heat and form a second heat source and wherein each of the secondary windings is fluidly connected to the plurality of power cells via one of the plurality of water-cooled buses such that water is received by the plurality of secondary windings from the heat exchanger via the plurality of power cells thereby cooling the power cells and the secondary windings and wherein each of the secondary windings provides electric current to the plurality of power cells for generating electric power in the power cells via one of the plurality of water-cooled buses.

2. The system of claim 1, further comprising a supply water manifold in fluid communication with the heat exchanger and the power cells.

3. The system of claim 2, further comprising a hose connected to the supply water manifold and at least one of the power cells.

4. The system of claim 1, further comprising a local manifold in fluid communication with one of the power cells and connected to three of the water-cooled buses.

5. The system of claim 4, wherein said local manifold distributes said water amongst said three of the water-cooled buses.

6. The system of claim 5, wherein each of said three of the water-cooled buses is in fluid connection with one of said secondary windings.

7. The system of claim 1, further comprising a return water manifold in fluid communication with the multi-winding device and the water pump.

8. The system of claim 1, wherein said heat exchanger is a water-to-air heat exchanger.

9. The system of claim 1, wherein each of the plurality of water-cooled buses includes a connector comprising a self-sealing valve.

10. The system of claim 1, wherein the heat exchanger is a forced cooled water heat exchanger.

11. A system for cooling a multi-cell power supply, the system comprising:
   a water pump;
   a heat exchanger in fluid communication with the water pump;
   a supply water manifold in fluid connection with the heat exchanger;
   a plurality of power cells in fluid communication with the supply water manifold, wherein each of the power cells generates heat and forms a first heat source;
   a plurality of water-cooled buses operably connected to the plurality of power cells; and
   a multi-winding device comprising:
      a primary winding, and
      a plurality of secondary windings for supplying power to the plurality of power cells, wherein the secondary windings generate heat and form a second heat source and wherein each of the secondary windings is fluidly connected to the plurality of power cells via one of the plurality of water-cooled buses such that water is received by the plurality of secondary windings from the heat exchanger via the plurality of power cells thereby cooling the power cells and the secondary windings and wherein each of the secondary windings provides electric current to the plurality of power cells for generating electric power in the power cells via one of the plurality of water-cooled buses.

12. The system of claim 11, further comprising a local manifold in fluid connection with at least one of said power cells and connected to three water-cooled buses.

13. The system of claim 12, wherein said local manifold distributes the water amongst said three of the water-cooled buses.

14. The system of claim 13, wherein each of said three of the water-cooled buses is in fluid connection with one of said secondary windings.

15. The system of claim 11, further comprising a return water manifold in fluid communication with the multi-winding device and the water pump.

16. The system of claim 11, wherein the heat exchanger is a water-to-air heat exchanger.

17. The system of claim 11, wherein the heat exchanger is a forced cooled water heat exchanger.

18. A method of operating a multi-winding power device, comprising:

delivering power from a plurality of power cells to a multi-winding power device via at least one of a plurality of water-cooled buses, wherein each of the power cells generates heat and forms a first heat source;

receiving power at the multi-winding device, wherein the multi-winding device comprises a plurality of secondary windings for supplying power to the plurality of power cells, wherein the secondary windings generate heat and form a second heat source and wherein each of the secondary windings is fluidly connected to the plurality of power cells via at least one of the plurality of water-cooled buses such that water is received by the plurality of secondary windings from the heat exchanger via the plurality of power cells thereby cooling the power cells and the secondary windings and wherein each of the secondary windings provides electric current to the plurality of power cells for generating power in the power cells via one of the plurality of water-cooled buses; and circulating water within the plurality of water-cooling buses to the plurality of power cells and the multi-winding device while the delivering occurs.

19. The method of claim 18, further comprising distributing the water to each of the plurality of the power cells so that the water warms by absorbing heat from each of the plurality of the power cells.

20. The method of claim 19 further comprising:

circulating the warmed water to the heat exchanger that cools the water; and re-distributing the cooled water to at least one power cell.

* * * * *